United States Patent [19]

Bullister

[11] Patent Number: 5,712,763

[45] Date of Patent: Jan. 27, 1998

[54] COMPATIBLE INTERNAL AND EXTERNAL CARD SLOT SYSTEM FOR A PORTABLE COMPUTING DEVICE HAVING A CONNECTOR OFFSET BETWEEN OPPOSING SIDE WALLS

[76] Inventor: Edward T. Bullister, 86 Concord St., Newton, Mass. 02139

[21] Appl. No.: 558,785

[22] Filed: Nov. 16, 1995

[51] Int. Cl.⁶ .............................. G06F 1/16; H05K 5/02; H05K 7/10
[52] U.S. Cl. ................................................ 361/686
[58] Field of Search ........................... 439/377, 638, 439/650, 654, 540.1, 928.1; 364/708.1; 361/684, 686, 737

[56] References Cited

U.S. PATENT DOCUMENTS

| | | | |
|---|---|---|---|
| 5,184,282 | 2/1993 | Kaneda et al. | 361/737 |
| 5,315,478 | 5/1994 | Cadwell et al. | 361/684 |
| 5,504,649 | 4/1996 | Hosoya et al. | 361/686 |
| 5,531,615 | 7/1996 | Irlbeck et al. | 439/377 X |

*Primary Examiner*—Michael W. Phillips

[57] ABSTRACT

A connector with two mating surfaces is configured within a computer housing to accept removable PC cards. These connector surfaces are capable of mating with PC cards mounted both internally and externally to the housing. The bottom surfaces of the externally mounted PC cards are flush with a lower external surface of the computer housing. This configuration allows external cards to be supported by any flat surface upon which the computer rests without the requirement for the space of an additional internal slot. The connector is offset between opposing sides of the housing. When a PC card is connected to the connector from a first side a maximum of 25% of the length of the PC card fits within the housing and when connected to the connector from a second opposing side a minimum of 75% of the length of the PC card fits within the housing.

6 Claims, 5 Drawing Sheets

COMPATIBLE INTERNAL AND EXTERNAL CARD SLOT SYSTEM FOR A PORTABLE COMPUTING DEVICE HAVING A CONNECTOR OFFSET BETWEEN OPPOSING SIDE WALLS

FIELD OF INVENTION

This invention relates to connectors for portable computer expansion cards, and in particular those used with combinations of internal and external slots which have different lengths and orientations but which are compatible with a common set of expansion cards.

BACKGROUND

Portable computing devices are useful in many applications. One factor which contributes to the utility of these devices is the compactness of the device. A second factor is the ability of the device to accept modular, plug-in devices which can increase the capabilties of the portable computing device and adapt it to meet varying requirements.

A system of modular plug-in cards was developed for desktop computing devices, and specifically, for IBM-compatible personal computers (PC's). Modular plug-in cards typically include a printed circuit board with circuitry to perform a function and a physical connector to provide an electrical and possibly physical connection to the computing system. These cards enable a core computer system of a standard design to be reconfigured by accepting various combinations of peripheral devices such as disk drives, graphics cards, modems, etc. These modular cards enable a system to be upgraded even after its purchase, to adapt to developing technology, and to fulfill needs for functionality not anticipated at the time of purchase.

An enhanced system of modular plug-in cards was developed for portable computing devices, and specifically, a system of cards commonly known as PCMCIA cards or PC cards. PCMCIA cards can be used in desktop PC's, in portable PC's, and in the smaller pen-based computers and calculators. This system of PC cards allows for "hot" insertion and removal, that is, insertion and removal of the card while the system is powered on.

PCMCIA cards are installed into a PCMCIA slot. The PCMCIA slot consists of a connector at the end of a cavity into which the PCMCIA card is inserted. In portable computing devices, most or all of the PCMCIA card is contained and protected within the slot upon insertion.

PCMCIA cards have the length of 85.6 mm and a width of 54 mm, which corresponds approximately to the size of a standard business or credit card. PCMCIA cards are classified as type I, II, or III, corresponding to thicknesses of 3.3 mm, 5.0 mm, and 10.5 mm, respectively.

The design allows a slot of a given type to accept a card of the same or lower type. It is also possible to mount two adjacent connectors in a slot of thickness 10.5 mm so that the slot can accomodate either a single type III (10.5 mm) card or two type II (5 mm) cards.

The space required by the slot in the electronic device can be substantial. In very compact computers, only a single type II slot is typically made available. There is no simple migration path to expand the number of PCMCIA slots, and substantial new investment is required to upgrade.

A second system for connection of modular, plug-in devices features an externally mounted device. The external device can be connected to the computing device via a cable. The external device can alternately be attached directly to an external connector, which in addition to electrical connection, provides cantilevered mechanical support. This system is commonly used with modems and external disk drives. Again, the mounting systems for the internal and external devices are not compatible; an internal modem cannot readily be interchanged with an external modem and an internal disk drive can be mounted externally only if an additional expansion box is used to replicate the internal mounting system within the computer.

Thus it is highly desirable to have a system of removable PC cards and slots which can interchangably accept cards of variable length. It is also desirable to have access to this system even in the most compact portable computing device.

SUMMARY

This invention provides a system for combining a internally-facing connector such as one in a PCMCIA slot with a fully compatible externally-facing connector. It allows this combination to be incorporated into a single combined connector.

One embodiment of this invention further locates the externally facing connector such that the card surface is parallel to and flush with an external surface of the computer, so that a flat surface supporting the computer also provides support for the otherwise cantilevered external card.

A second embodiment of this invention uses a shortened card in conjunction with the shortened slot.

A third embodiment of this invention combines the card slot with an external peripheral component which has a second point of mechanical attachment. In this embodiment, the second attachment point helps align the card for insertion. Once inserted, both attachment points provide mechanical support for the peripheral device.

All of the embodiments in this invention are compatible with each other and with cards currently in use. This system gives a migration path toward shorter cards and more compact computer systems while preserving the investment in the longer cards.

BRIEF DESCRIPTION OF THE DRAWINGS

The features, aspects, and advantages of the present invention will become better understood with regard to the following description, appended claims and accompanying drawings, where:

DESCRIPTION OF THE PREFERRED EMBODIMENT

The advantages of the current system are better understood by reference to the drawings.

Figure 1:
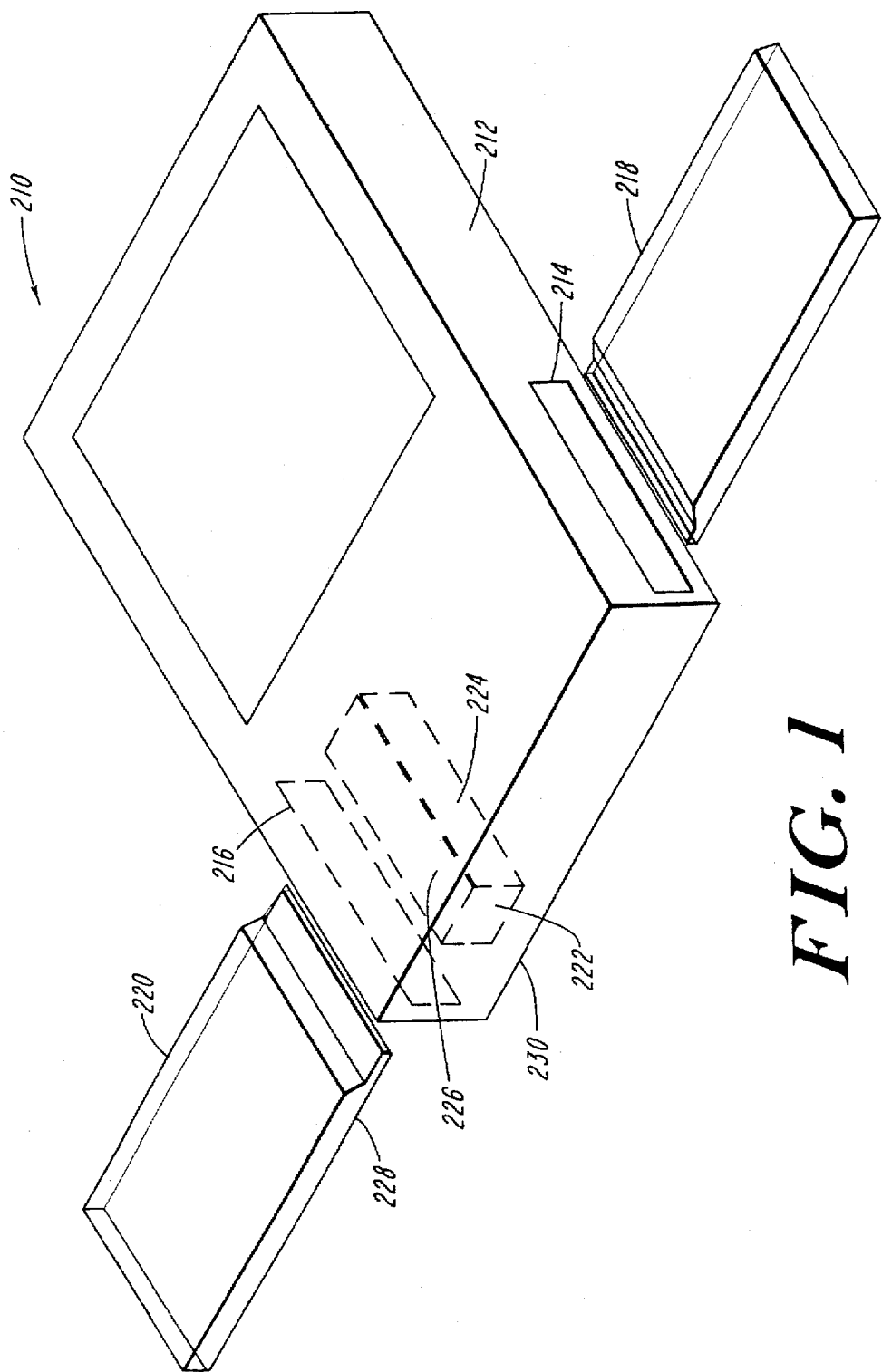
FIG. 1 is a perspective view of a computing device containing an electrical connector within a housing.
Figure 2:
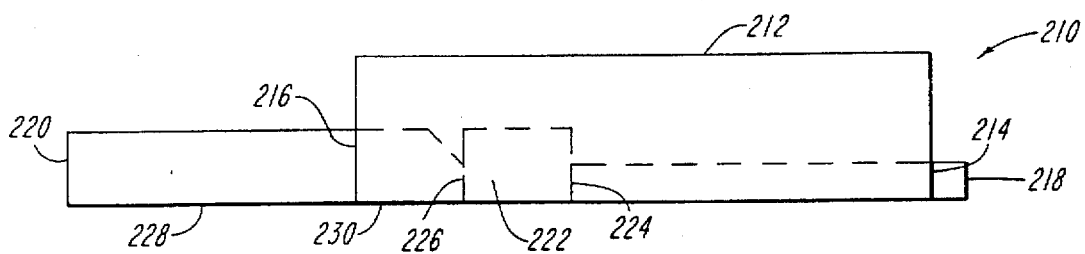
FIG. 2 is an end view of the computing device shown in FIG. 1.
Figure 3:
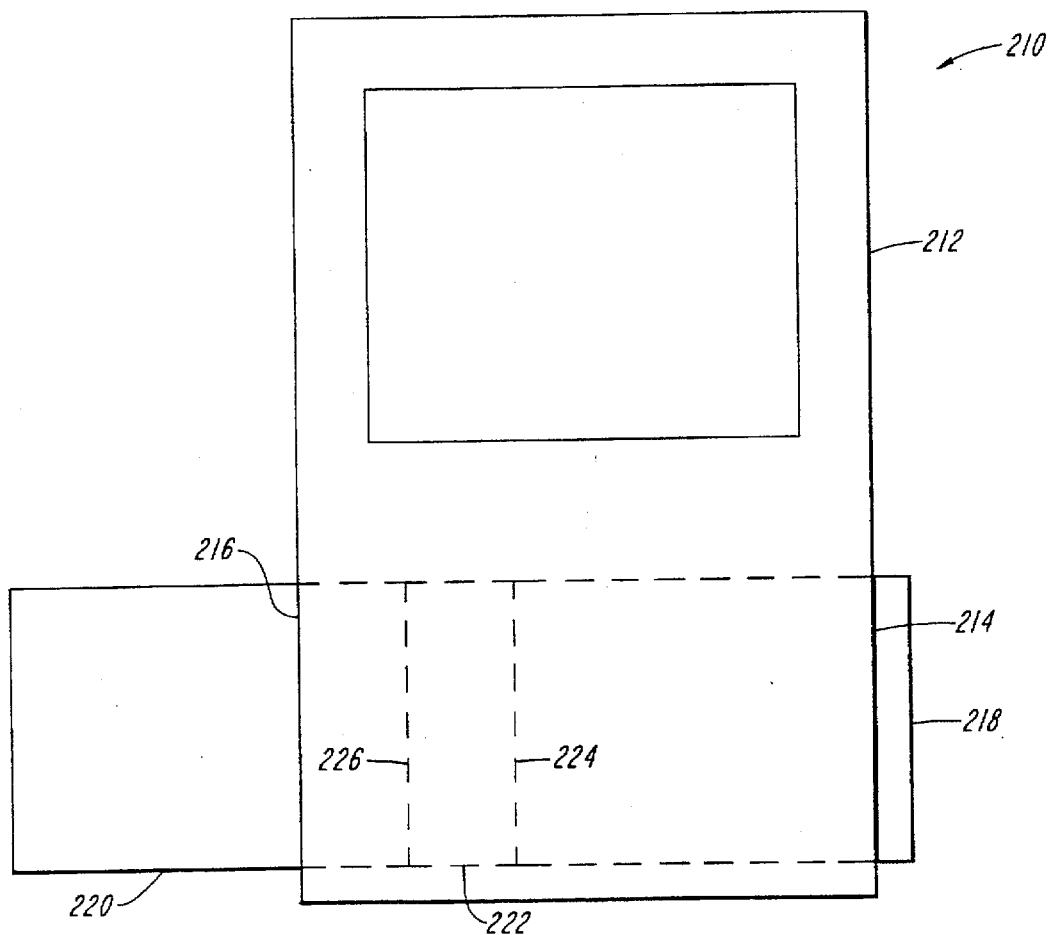
FIG. 3 is a top view of the computing device shown in FIG. 1.

Referring to FIGS. 1-3, a computing device 210 includes a housing 212. The openings 214 and 216 in the housing 212 facilitate insertion of PC cards 218 and 220. A connector 222 is located within the housing 212. The connector 222 is oriented relative to the housing 212 such that removable system components such as PC cards 218 and 220 can be inserted through openings 214 and 216 and mated with the mating surfaces 224 and 226 of the connector 222.

Openings 214 and 216 are located at opposite surfaces of housing 212. This is desirable when a single contiguous surface is not available.

Referring to FIGS. 2., 7a, and 7b, the connector 222 and PC card 220 are oriented such that the lower surface 228 of PC card 220 is approximately flush with the lower surface 230 of the housing 212. This allows the protruding, cantilevered PC card 220 to be supported by the surface on which the device rests. This reduces the stress on the protruding PC card 220 and on the connector 222. This configuration in which a PC card 220 protrudes is appropriate, for example, when the PC card temporarily tethers the portable device 210 to a network. In this situation the PC card 220 can be removed before the device 210 is moved. Thus, the danger of damage to the PC card 220 or the device 210 is greatly reduced.

Figure 4:
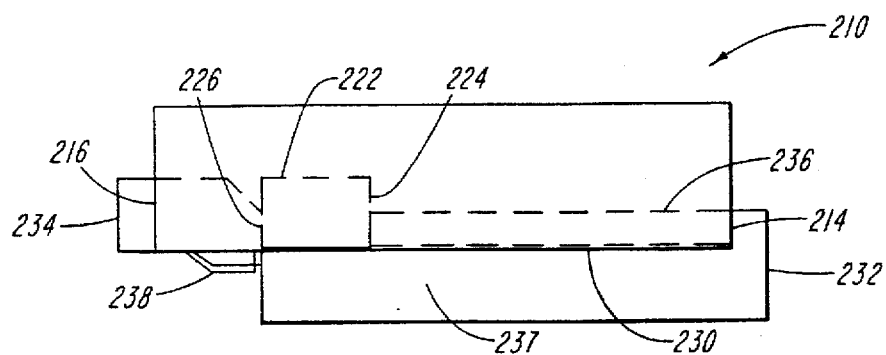
FIG. 4 is an end view of the computing device with a shortened card in the external slot and an external peripheral device secured by the internal slot.
Figure 5:
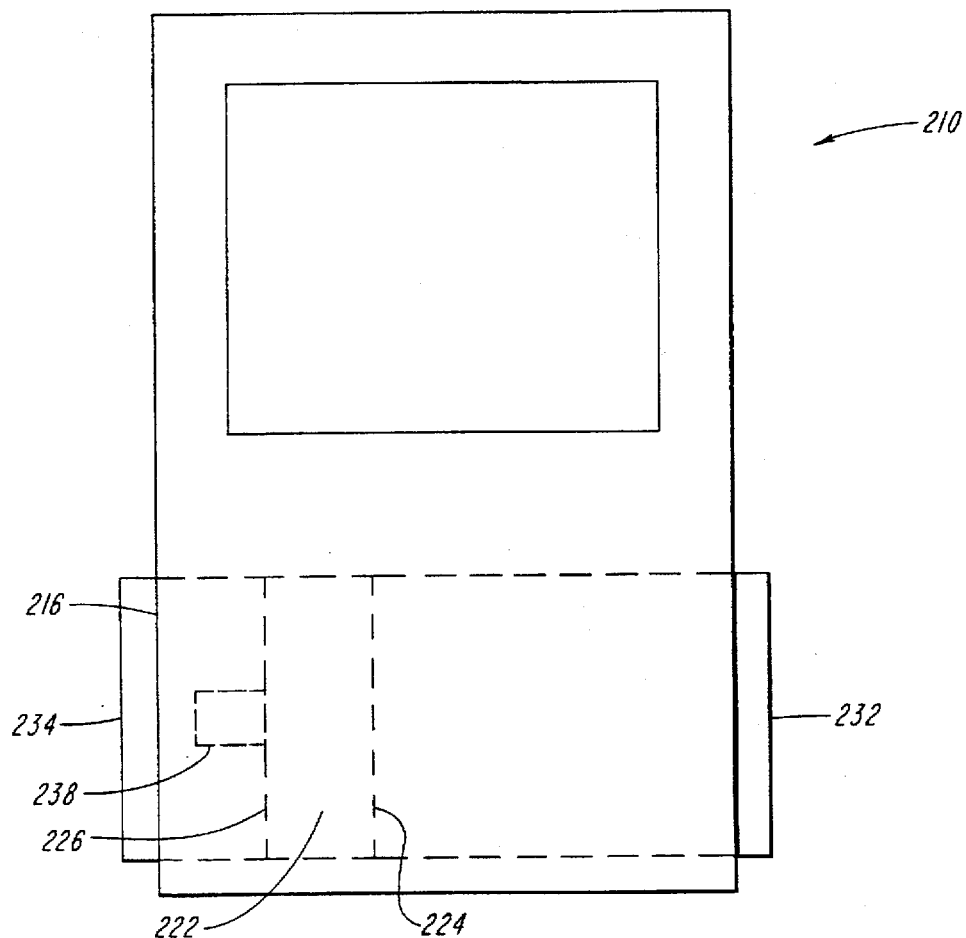
FIG. 5 is a top view of the computing device shown in FIGS. 4.

FIGS. 4 and 5 show the device 210 with a shortened card 234 and an external peripheral 232. The card 234 and the peripheral 232 are electrically compatible with the connector 222 and its mating surfaces 224 and 226. However, their mechanical design differs from the PC cards 218 and 220.

Card 234 is a shortened PC card. Card 234 may remain protected in the shortened slot formed between the mating surface 226 and the opening 216. In contrast to the full-length PC card 220, the device 210 may be transported with the shortened card 234 inserted without endangering the card 234.

Peripheral device 232 includes an arm 236 which mates with mating surface 224. Device 232 also includes an arm 237 which extends parallel to arm 236 and external to lower surface 230. The lower surface 230 of the housing 232 is trappped between these u-shaped arms of device 232. The location of arm 236 within opening 214 and the mating of arm 236 with mating surface 224 further positions device 232 with respect to device 210. A catch 238 secures the external end of the peripheral device 232 to the lower surface of the device 210. Peripheral device 232 may be a external disk or CD-ROM drive which is too bulky to be contained internally within the device 210 This design minimizes the need for mechanical connectors and obviates the need for electrical cables to connect devices 210 and 232.

Peripheral device 232 may alternately be a stationary mount or docking station. Again, in this case the card slot provides both electrical and mechanical connectivity between the device 210 and the peripheral device 232.

Figure 6:
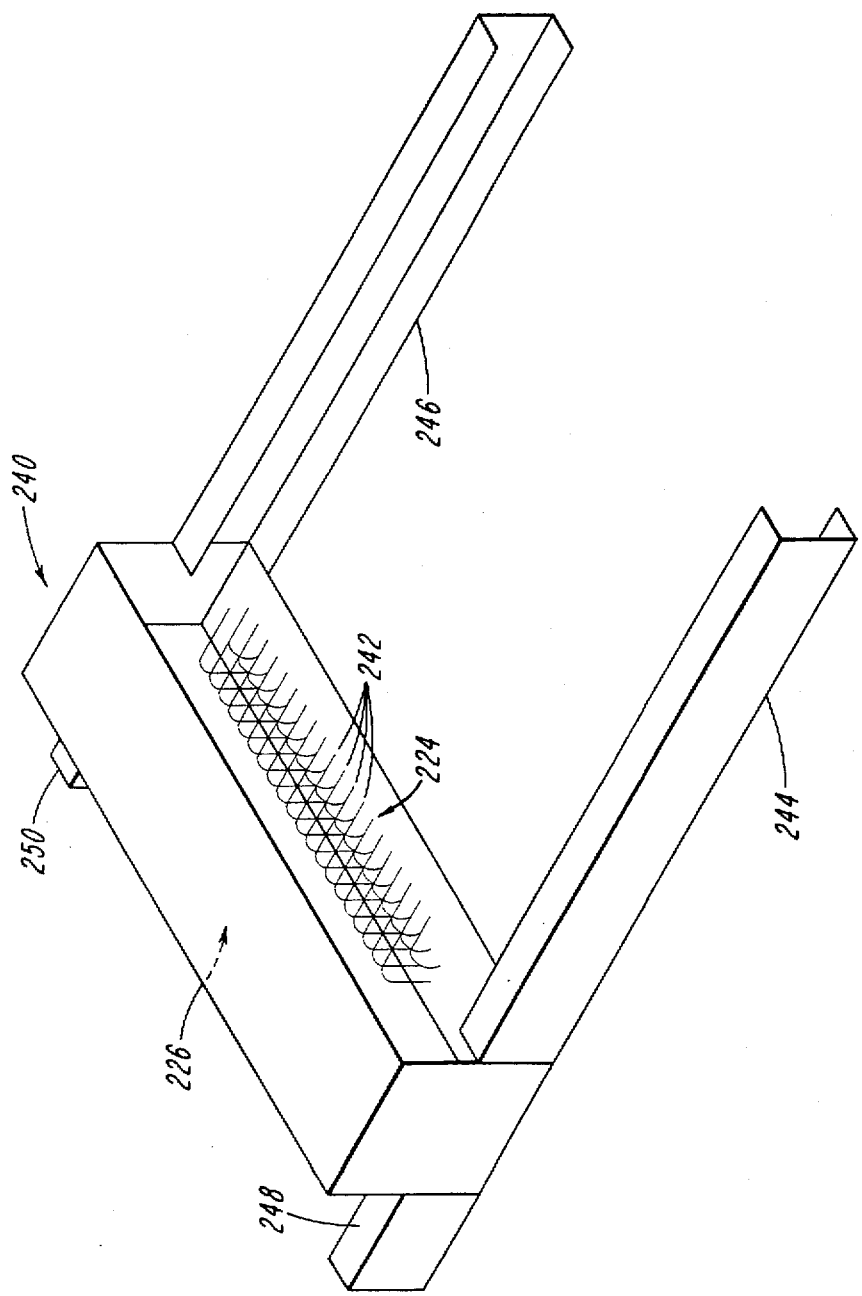
FIG. 6 is a perspective view showing the details of a dual-faced electrical connector with guide rails adjacent to each mating surface.
Figure 7A:
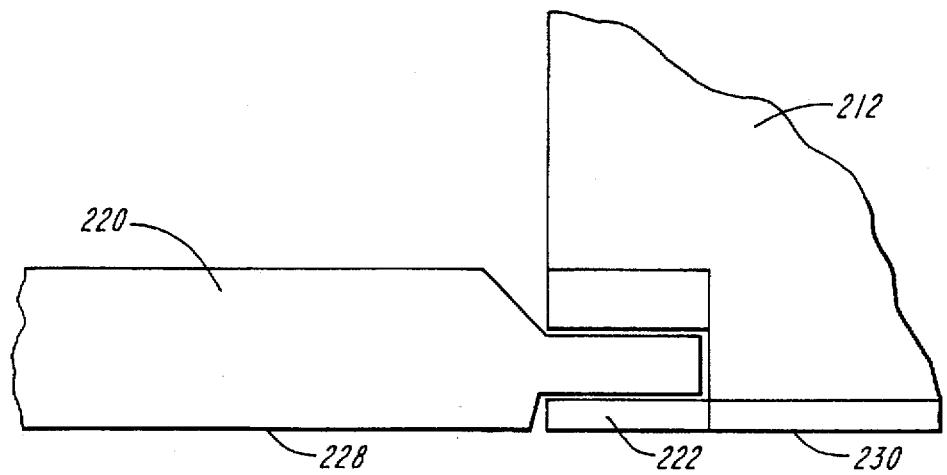
FIG. 7 is a detailed end view of the computing device shown in FIG. 1 showing the alignment of the lower card and housing surfaces.
Figure 7B:
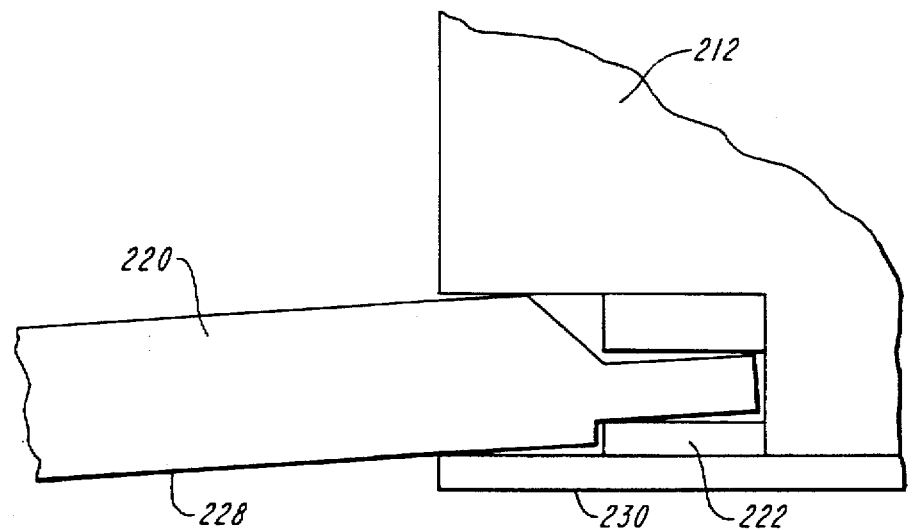

A connector 240 is detailed in FIG. 6. Two electrically compatible mating surfaces 224 and 226 face away from each other and typically toward openings in housing 212. Within these mating surfaces 224 and 226, sets of pins 242 are elements that provide an electrical connection to removable system components such as PC cards 218 and 220. Guide rails 244, 246, 248, and 250 orient and align the PC cards 218 and 220 relative to the mating surfaces 224 and 226 and specifically relative to the pins 242. The guide rails can also secure external peripherals with respect to the housing 212. A shortened set of guide rails 248 and 250 correpond to a shortened distance to the opening 216 in the housing 212 and a smaller housing 212.

A device 210 has been disclosed which includes a connector and connecting system capable of accepting a wide variety of internal and external peripheral devices. The components of the device have multiple functions and the result is a very versatile and compact device 210. This enables a very compact and very portable device 210 to be configurable to achieve the full functionality of a larger computer without compromising its portability.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

Having described the invention, what is claimed is:

1. A computing device comprising:

a housing having first and second opposing sides, said first side having a first opening arranged therein, said second side having a second opening arranged therein, said first opening located opposite said second opening;

an electrical connector located within said housing, said electrical connector having first and second sets of connecting elements adapted to mate with removable computer components, said first and second sets of connecting elements arranged on opposing sides of said electrical connector; and said electrical connector located between said openings and spaced between said openings such that when a first removable computer component having a length is mated with said first set of connecting elements and a second removable computer component having the same length as said first removable computer component is mated with said second set of connecting elements a maximum of 25% of said length of said first removable computer component fits within said housing and minimum of 75% of said length of said second removable computer component fits within said housing.

2. The computing device of claim 1 wherein said first set of connecting elements and said second set of connecting elements are adapted to mate with the same type of removable computer components.

3. A computing device comprising:

a housing having a first opening for insertion of removable computer components and a second opening for insertion of removable computer components;

a first electrical connector located within said housing, said first electrical connector having a first set of connecting elements adapted to mate with removable computer components;

a second electrical connector located within said housing, said second electrical connector having a second set of connecting elements adapted to mate with removable computer components; and said first electrical connector facing said first opening and spaced a first distance from said first opening;

said second electrical connector facing said second opening and spaced a second distance from said second opening;

wherein the ratio of said second distance to said first distance is at least 3:1.

4. The computing device of claim 3, further comprising first and second opposing sides on said housing, wherein said first opening is located on said first side, and said second opening is located on said second side.

5. The computing device of claim 3 wherein said first set of connecting elements and said second set of connecting elements are adapted to mate with the same type of removable computer components.

6. The computing device of claim 3 wherein the first distance and second distance are such that when a first removable computer component having a length is mated with said first set of connecting elements and a second removable computer component having the same length as said first removable computer component is mated with said second set of connecting elements a maximum of 25% of said length of said first removable computer component fits within said housing and minimum of 75% of said length of said second removable computer component fits within said housing.

* * * * *